United States Patent
Berns et al.

[11] 3,931,549
[45] Jan. 6, 1976

[54] CONTROL CIRCUIT FOR ELECTROMAGNETIC TRANSDUCER

[75] Inventors: Charles Berns, Fairfield; Jacob Neuhof, Bridgeport, both of Conn.

[73] Assignee: General Signal Corporation, Rochester, N.Y.

[22] Filed: Oct. 24, 1974

[21] Appl. No.: 517,681

[52] U.S. Cl......... 317/148.5 R; 317/155.5; 331/112; 340/384 E
[51] Int. Cl.² ............................. H01H 47/32
[58] Field of Search... 317/148.5 R, 155.5, 155.5 A, 317/DIG. 6; 318/130; 310/DIG. 1; 340/403, 384 E, 388, 402; 331/108 R, 111, 112

[56] References Cited
UNITED STATES PATENTS

| | | | |
|---|---|---|---|
| 2,843,742 | 7/1958 | Cluwen | 318/130 |
| 2,854,660 | 9/1958 | Best, Jr. et al. | 340/403 |
| 2,866,925 | 12/1958 | Wunderman | 317/155.5 |
| 2,920,259 | 1/1960 | Light | 331/111 X |
| 2,977,418 | 3/1961 | Haas | 331/112 X |
| 3,117,265 | 1/1964 | Favre | 318/130 |
| 3,161,836 | 12/1964 | Miller | 317/148.5 R |
| 3,440,564 | 4/1969 | Kuiper | 331/112 |

FOREIGN PATENTS OR APPLICATIONS 1,252,728 10/1967 Germany ............. 331/112

Primary Examiner—J. D. Miller
Assistant Examiner—Harry E. Moose, Jr.
Attorney, Agent, or Firm—Milton E. Kleinman; George W. Killian

[57] ABSTRACT

An electronic circuit including a transistor which is biased to conduction is provided to initiate actuation of an electromagnetic transducer. The transducer has first and second coils one of which actuates the sounder. A potential is induced in the other coil and this induced potential is used to cut off the transistor. The next cycle of operation is initiated when the induced potential falls below a predetermined value in response to the reduction of the magnetic flux which, in turn, was the result of the transistor having been cut off.

7 Claims, 4 Drawing Figures

CONTROL CIRCUIT FOR ELECTROMAGNETIC TRANSDUCER

BACKGROUND OF THE INVENTION

The present invention relates to a driving circuit for an electrically operated sound producing device and in particular to a direct current actuated vibratory horn. A wide variety of devices of this class have been designed to meet specific requirements of size, operating voltage, desired sound volume and/or frequency content, cost and other considerations. The described structure is one which can be mass produced economically and be responsive to a relatively wide range of applied direct current potential to produce an exceptional sound output for the power consumed.

The mechanical structure of the sound producing device may be somewhat similar to that disclosed in the co-pending Charles Berns application, Ser. No. 431,802 filed, Jan. 8, 1974, and entitled Buzzer Construction and Method of Adjusting the Same.

More particularly, the present invention relates to an electronic means for controlling an electromechanical transducer and vibrating the diaphragm thereof at a frequency of the order of 2,200 Hertz.

SUMMARY OF THE INVENTION

The present invention uses an electronic circuit for driving an electromechanical transducer. The electronic circuit employs a single transistor, biasing resistors, a capacitor and the winding of the electromechanical transducer which has been divided into two separate windings on a common core. The primary winding of the transducer has several times more turns than the secondary winding of the transducer. The windings are coupled for series conduction when the transistor is turned on and in a sense for the secondary winding to have induced therein an electromotive force which is in opposition to that of the primary winding. In response to the build-up of the magnetic flux in the core of the transducer a potential is induced in the secondary winding and this potential reverse biases the transistor to cut it off and terminate one cycle of operation. No mechanical interruption is required but could be used for intermittent operation.

It is an object of the invention to provide a new and improved electromechanical transducer.

It is a more specific object of the invention to provide a new and improved electromechanical transducer which is controlled by an electronic circuit.

It is an even more specific object of the invention to employ the inductive circuit of the transducer in the control circuit for the transducer.

It is another object of the invention to employ an induced voltage in a secondary winding of the transducer to control the current in the transducer.

It is another object of the invention to employ a voltage induced in a secondary winding of the transducer to cut off a transistor and terminate the flow of current in the transducer.

BRIEF DESCRIPTION OF THE DRAWING

The foregoing objects and advantages together with other objects and features of the invention will be more readily perceived when the following description is considered together with the accompanying drawing in which.

DESCRIPTION OF THE PREFERRED EMBODIMENT

Figure 1:
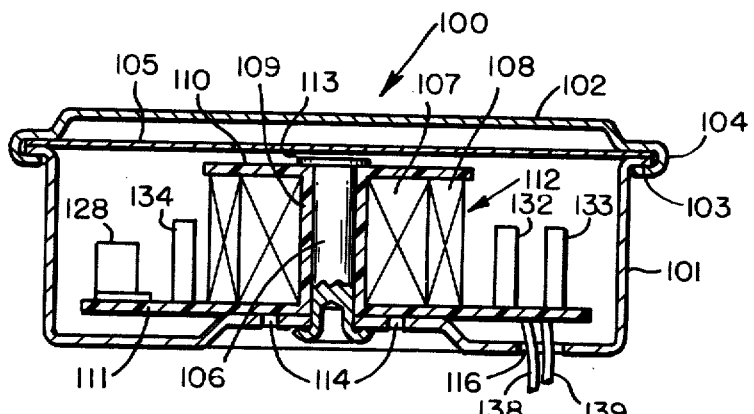
FIG. 1 is a cross-section view of a transducer using the present invention.

The present invention can function with a wide variety of electromechanical transducers, bells, buzzers, and similar devices. FIG. 1 illustrates a typical electromechanical transducer 100 which may be employed. The illustrated transducer comprises a cup-shaped lower housing 101 and a saucer-shaped cover 102. The lower housing 101 has a lip 103. The cover 102 may be joined to the lower housing 101 by crimping an edge 104 of the cover 102 over the lip 103. Clamped between the cover 102 and the lower housing 101 is a diaphragm 105 which, in this sounder, is the vibratory sound producing element. The diaphragm may advantageously be supported to bias it to a concave position although it may also be planar. The cover 102 and/or lower housing 101 may have sound transmitting holes (not shown). The diaphragm 105 will be excited into vibration in response to a build-up and decay of magnetic flux between the core 106 and the diaphragm 105. The magnetic circuit for actuating the diaphragm includes the core 106, the lower housing 101, the diaphragm 105 and the air gap 113. The magnetic flux is generated in response to an electric current in the coil surrounding the core 106. The coil of the transducer 100 comprises two portions; an inner coil, or primary winding 107, and an outer coil, or secondary winding 108. The arrangement of these coils on the core 106 may vary in accordance with engineering and design considerations. For example, the secondary winding 108 could be close to the core 106 and the primary winding 107 could be wound on top of the secondary winding 108. Or the primary winding 107 could be at one end of the core 106 and the secondary winding 108 at the other end of the core 106. The important consideration is the characteristics of the primary winding with respect to the secondary winding. In the circuit considered herein, the primary coil 107 has a number of turns which are approximately five or six times the number of turns on the secondary coil 108. Because of differences in wire sizes, the primary winding has a resistance between two and four times that of the secondary 108. The primary coil 107 and the secondary coil 108 are wound on a bobbin 109 which surrounds the core 106 and has an upper flange 110 and a lower flange 111. The lower bobbin flange 111 has a diameter which is significantly greater than the upper bobbin flange 110 and which nearly equals the interior diameter of the lower housing 101. The extra surface of the lower bobbin flange 111 is used for mounting circuit components and making electrical connections. An alternate structure using a printed circuit board for the components could be employed.

The bobbin 109 together with the primary and secondary coils 107 and 108 and other electrical components (to be described more fully hereinbelow) which are mounted on the lower bobbin flange 111 comprise a coil assembly 112. The coil assembly 112 is mounted on the core 106 and this sub-assembly is secured to the lower housing 101.

Figure 2:
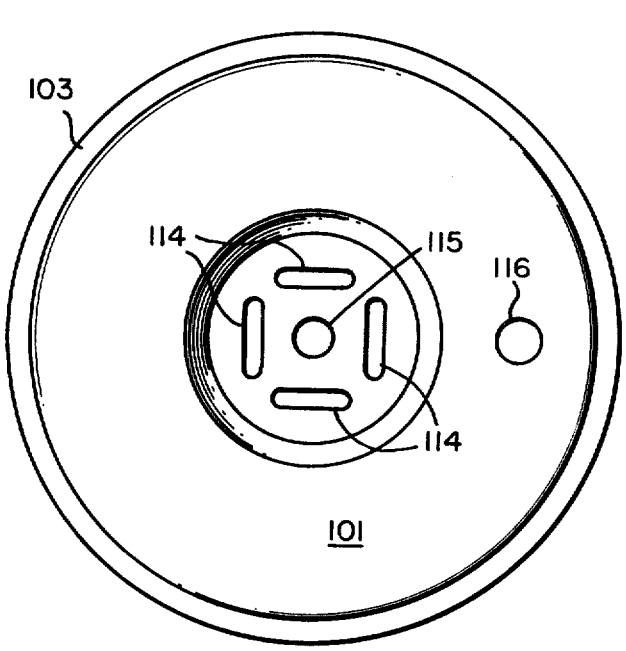
FIG. 2 is a bottom view of the transducer housing.

The dimensions are such that after assembly there is a space 113 between the face of the core 106 and the diaphragm 105. Tolerances are such that the space is acceptable or a little too large. If the space 113 is too large, it may be reduced by a means similar to that disclosed in the cited co-pending application of Charles Berns. More specifically, as seen in FIG. 2, which constitutes a bottom view of the lower housing 101, the lower housing includes four slots 114 and a hole 115. As previously suggested, the core 106 is inserted through the hole 115 and peened over to secure it to the lower housing 101. Final adjustment of the space 113 is made by applying power to the circuit and pressing in so that a portion of the lower housing 101 is deformed and the core 106 moved closer to the diaphragm 105. The elongated slots 114 facilitate this adjustment. The techniques, either manual or automatic, may be similar to those set forth in the cited Charles Berns application. Hole 116 is provided for bringing out the wires 138 and 139 to connect the circuit to a power supply.

Figure 3:
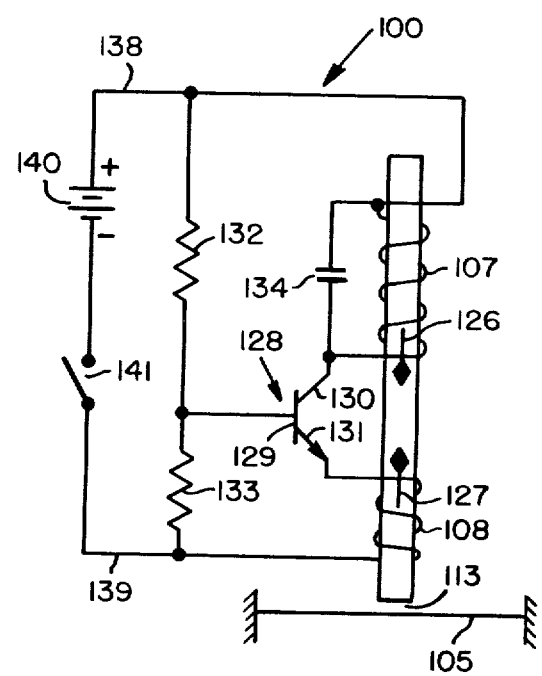
FIG. 3 constitutes a circuit diagram of the circuit for controlling the operation of the transducer.

Considering now FIG. 3., there is shown therein a schematic circuit for driving the transducer 100. Components which have been identified in FIG. 1 and which are schematically indicated in FIG. 3 are identified by the same numbers in both figures. In a similar manner, elements to be identified in FIG. 3 may also be identified in FIG. 1 with the same numbers.

Considering now more specifically the circuit of FIG. 3, it will be seen that it comprises the primary winding 107 and the secondary winding 108 wound on the core 106. It should be particularly observed that the two coils are wound in an opposite sense. That is, if current flows through the coil 107 from the top to the bottom and generates a magnetic flux in the direction indicated by arrow 126, then a current flowing in secondary coil 108 from top to bottom will generate a magnetic flux indicated by the arrow 127 which is in opposition to the flux generated by the primary coil 107. That is, the magnetic fluxes generated by the two coils 107 and 108 will oppose each other and the resultant magnetic force will be equal to the difference between the two fluxes. As will be seen as the description proceeds, the primary and secondary coils 107 and 108, respectively, are essentially in series, and therefore, will normally have the same current. However, since the primary winding 107 has significantly more turns than the secondary winding 108 and since the magnitude of the magnetic flux 126 and 127 is a function of the ampere turns of their respective coils, it will be seen that the primary winding 107 will generate a significantly larger magnetic flux 126 than that generated by the secondary winding 108. Accordingly, the resultant flux will be in the direction indicated by the arrow 126.

The circuit includes a transistor 128 having a base 129, a collector 130, and an emitter 131. The lower end of the winding 107, as viewed in FIG. 3, is coupled to the collector 130 of the transistor 128, and the upper end of the primary 107 is coupled to the base 129 of the transistor 128 through a resistor 132. The upper end of the secondary winding 108 is coupled to the emitter 131 of the transistor 128 while the lower end of the secondary winding 108 is coupled to the base 129 of the transistor 128 through resistor 133. A capacitor 134 is coupled across the primary winding 107. The resistor 132 is approximately ten times that of the resistor 133. Two leads, 138 and 139, are provided for coupling the circuit of FIG. 3 to an external direct current power source 140. Terminals may be used instead of leads 138 and 139.

When switch 141 is closed, direct current will flow from the positive terminal of direct current potential source 140 through resistors 132 and 133 and back to the source 140 through switch 141. This will place the base 129 of the transistor 128 at a potential which is slightly positive relative to the negative potential of the source 140. The emitter 131 of the transistor 128 will be at the negative potential of the source 140 at time $t = 0$ (i.e. at the instant of closing the switch 141) and before any current has started to flow through the transistor 128. The transistor 128 is an NPN type and, therefore, when the switch 141 is closed the base 129 will be positive, with respect to the emitter, which is the condition for turning on the transistor 128 and initiating conduction from the collector 130 to the emitter 131. With the transistor 128 biased to conduction, current will attempt to flow from the positive terminal of source 140 through lead 138 and through the parallel combination of capacitor 134 and primary coil 107 to the collector 130 of transistor 128 and to the emitter 131, through secondary winding 108 and back through lead 139 and switch 141 to the negative terminal of source 140. At time $t = 0 + \Delta t$ the inductance of the secondary winding 108 will inhibit the flow of current and relatively little current will flow. The inductance of the primary winding 107 will have the same effect but, in addition, the capacitor 134 shunts the primary winding 107 and the initial current is through capacitor 134. However, as soon as any current starts to flow through capacitor 134, it no longer serves as a zero impedance shunt and some current will also flow through primary coil 107. As time advances, the capacitor 134 will become fully charged and the current through the primary and secondary coils 107 and 108, respectively, will build up and there will be a resultant flux in the direction shown by arrow 126. As the current is increasing and the flux is changing, a potential will be induced in the secondary winding 108. As a consequence of the mentioned turns ratio of the two coils and the sense in which the two coils are connected, the voltage induced in coil 108 will be such as to place a positive potential at the upper terminal coil 108. By an appropriate choice of applied potential 140, base biasing as provided by resistors 132 and 133, together with a consideration of the characteristics of the primary and secondary coils 107 and 108, respectively, it will be possible to cause the induced voltage in secondary coil 108 to reverse bias the transistor 128 and terminate conduction thereof. With transistor 128 turned off, current will still circulate in the series circuit comprising primary coil 107 and capacitor 134 to dissipate the inductive energy stored in coil 107. However, due to the inherent resistance of the circuit, the current in coil 107 will decay and the magnetic flux will be reduced. The changing magnetic flux density will continue to induce a voltage in the secondary winding 108. Eventually the current in the primary winding 107 will be greatly reduced, there will be very little magnetic flux, and the potential induced in the secondary winding 108 will be inadequate to hold the transistor 128 cut-off. Accordingly, conduction through the transistor 128 will resume and the cycle described will be repeated.

The movement of the diaphragm 105 towards the core 106 and the concomitant reduction in the air gap 113 will tend to reduce the reluctance of the magnetic circuit and thereby provide an increase in flux density which will have an additional tendency to increase the potential induced in coil 108. The transistor 128 serves as a potential sensing means. That is, when the induced voltage across coil 108 rises sufficiently, the transistor 128 will be biased to cut-off.

As is well known a diaphragm, such as diaphragm 105, will have a natural frequency of vibration which depends upon various physical characteristics of the diaphragm and the mode of mounting, etc. In a similar manner, the choice of transistor, together with the magnitude of the potential, resistor and capacitor values and characteristics of the coils will produce a circuit which has a natural cyclical repetition rate. For optimum operation, the electrical and mechanical vibration rates should be selected to be compatible. For example, at approximately the time that the electrical circuit had produced sufficient magnetic flux for the required length of time to move the diaphragm 105 nearly its maximum amount towards the core 106, the transistor should be turned off for approximately the period of time to allow the diaphragm 105 to spring away from the core 106 and travel approximately the same distance the other side of its neutral position. The particular electromechanical transducer, for which the present system was developed, vibrated at a frequency of approximately 2,200 Hertz. With a 2N3417 transistor, resistances of 120 kilo ohms and 15 kilo ohms for resistors 132 and 133, respectively, primary and secondary coils having approximately 1,350 and 250 turns, respectively, a direct current potential within the range of approximately 6 to 30 volts and a capacitor of approximately 0.040 micro-farads, a reasonably stable frequency was obtained with a sound output of over 80 decibels measured at a distance of 1 foot. The shape of the potential wave across coil 107 is approximately sinusoidal.

Figure 4:
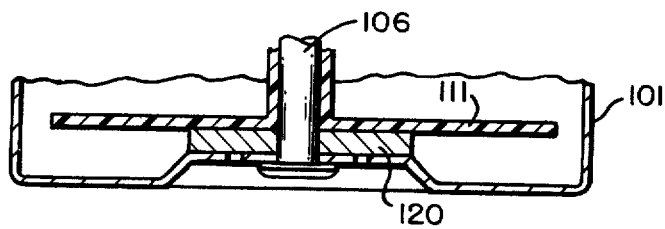
FIG. 4 is an enlarged view of a portion of FIG. 1 showing a modified form of the structure.

In FIG. 4 an alternate design is illustrated which includes a permanent magnet 120 so that there is always a residual flux in the magnetic circuit of the electromechanical transducer. With this structure, the magnitude of the space 113 is less critical, and therefore little, if any, adjustment of the space 113 may be required.

While there has been shown and described what is considered at present to be the preferred embodiment of the invention, modifications thereto will readily occur to those skilled in the applicable arts. For example, it would be relatively simple to modify the circuitry and use a PNP transistor instead of an NPN transistor. Or instead of a vibratory diaphragm, a reciprocating armature could be employed to strike a gong. It is believed that no further analysis or description is required and that the foregoing so fully reveals the gist of the present invention, that those skilled in the related arts can adapt it to meet the exigencies of their specific requirements. It is not desired, therefore, that the invention be limited to the specific embodiments shown and described, and it is intended to cover in the appended claims all such modifications as fall within the true spirit and scope of the invention.

What is claimed is:

1. A circuit for driving an electromagnetic transducer comprising:
    a. a transistor having base, collector and emitter electrodes:
    b. a direct current potential source;
    c. an electromagnetic transducer having first and second inductively coupled coils for producing opposing and unequal magnetomotive forces in response to a flow of direct current from said direct current potential source through said coils;
    d. said first coil being in a circuit between one terminal of said potential source and said collector electrode and said second coil being in a circuit between the other terminal of said potential source and said emitter electrode;
    e. first bias means for coupling a control potential derived from said potential source to said base electrode for biasing said base to a predetermined potential; and
    f. second bias means including inductive action between said first and second coils for biasing said transistor.

2. The combination as set forth in claim 1, wherein said first coil has substantially more turns than said second coil so that the magnetomotive force generated by said first coil is significantly greater than the magnetomotive force generated by said second coil.

3. The combination as set forth in claim 2, wherein the inductive coupling between said first and second coils induces a potential in said second coil in response to current changes in said first coil for biasing said transistor to cut off.

4. The combination as set forth in claim 1, wherein a capacitor is coupled across said first coil.

5. An electromagnetic transducer having a driving circuit comprising:
    a. first and second windings on a common magnetic core coupled in a series circuit and in a sense for inducing a potential in said second winding which is in opposition to the potential across said first winding when a current flows in said series circuit;
    b. said first winding having a number of turns which is significantly greater than the number of turns of said second winding;
    c. a potential source coupled to said series circuit for producing a flow of current in said series circuit; and
    d. potential sensing means coupled to said series circuit to sense when the potential across said second winding exceeds a predetermined value and for terminating the flow of current in said series circuit in response to the potential across said second coil exceeding said predetermined value.

6. The combination as set forth in claim 5, wherein said potential sensing means is a transistor which is biased to cut-off when said predetermined potential value is exceeded.

7. The combination as set forth in claim 6 and including a capacitor in parallel with said first winding.

* * * * *